United States Patent [19]
Murray

[11] Patent Number: 4,845,727
[45] Date of Patent: Jul. 4, 1989

[54] DIVIDER CIRCUIT

[75] Inventor: Bruce Murray, Wokingham, England

[73] Assignee: U. S. Philips Corporation, New York, N.Y.

[21] Appl. No.: 122,984

[22] Filed: Nov. 19, 1987

[30] Foreign Application Priority Data

Dec. 5, 1986 [GB] United Kingdom ............. 8629108

[51] Int. Cl.⁴ .......................................... H03K 21/02
[52] U.S. Cl. ..................................... 377/43; 377/47; 377/104; 377/111
[58] Field of Search ................. 377/47, 48, 115, 43, 377/118, 104, 106, 111; 307/247.1, 262, 608, 272.2, 291, 289

[56] References Cited

U.S. PATENT DOCUMENTS

| | | | |
|---|---|---|---|
| 3,153,200 | 10/1964 | Wahrman et al. | 307/262 |
| 3,668,423 | 6/1972 | Couch | 307/262 |
| 3,851,258 | 11/1974 | Freedman | 377/43 |
| 4,300,039 | 11/1981 | Avins | 377/43 |
| 4,366,394 | 12/1982 | Clendening et al. | 377/47 |
| 4,574,206 | 3/1986 | Todokoro et al. | 307/608 |
| 4,651,334 | 3/1987 | Hayashi | 377/47 |

OTHER PUBLICATIONS

Digital Troubleshooting by Gasperini p9-3, "D Flip-Flop" pub. by Muvonics Co., Cal. copyright 1975.

Primary Examiner—John S. Heyman
Attorney, Agent, or Firm—Michael E. Marion

[57] ABSTRACT

A pulse train divider circuit includes a first flip-flop (1) whose Q output is connected to the D input of a second flip-flop (2) whose $\bar{Q}$ output is connected to the D input of the first flip-flop (1). A pulse train to be divided is applied via an input (3) directly to the clock input C of the first flip-flop (1) and via a circuit (4) which delays the pulse train applied to the clock input C of the flip-flop (2) to provide a given phase relationship between the pulse trains at the two clock inputs. The circuit divides-by-two, and the resulting divided pulse trains available at the various outputs have phase relationships depending on the phase relationship of the applied pulse trains at the clock inputs.

4 Claims, 3 Drawing Sheets

DIVIDER CIRCUIT

BACKGROUND OF THE INVENTION

The present invention relates to a pulse train divider circuit comprising first and second D-type flip-flops having the Q output of the first flip-flop connected to the D input of the second flip-flop whose $\bar{Q}$ output is connected to the D input of the first flip-flop, the pulse train to be divided being applied to the clock inputs of each of said flip-flops.

A divider circuit of the above type is disclosed in Electronic Letters, volume 18, number 13, dated June 24, 1982, at page 581. This reference shows two D-type flip-flops connected and driven to produce divide-by-four outputs of fixed phase relationship.

SUMMARY OF THE INVENTION

It is an object of the invention to provide a divider circuit of the type described in the opening paragraph having a different divisor.

The invention provides a pulse train divider circuit comprising first and second D-type flip-flops having the Q output of the first flip-flop connected to the D input of the second flip-flop whose $\bar{Q}$ output is connected to the D input of the first flip-flop, the pulse train to be divided being applied to the clock inputs of each of said flip-flops, characterised in that said divider circuit additionally comprises means for causing the pulse train applied to one of said flip-flops to be out of phase with the pulse train as applied to the other of said flip-flops, the circuit being capable of providing a divided pulse train at each output of each flip-flop at half the frequency of the applied pulse train, the divided pulse train present at an output of the first flip-flop having a specific phase relationship with the divided pulse train at an output of the second flip-flop which relationship depends on the phase relationship between the pulse trains as applied to the clock inputs of the first and second flip-flops.

Such a divider circuit has the advantage that it can divide by two and in addition the phase relationship between two outputs can be selected, within limits, by controlling the phase relationship of the pulse train as applied to the clock inputs of the respective flip-flops.

When the means causes the pulse train applied to the clock input of the first flip-flop to lead the pulse train applied to the corresponding input of the second flip-flop by N degrees the divided pulse train at an output of the said first flip-flop leads the divided pulse train at the corresponding output of the second flip-flop by $\frac{1}{2}$N degrees. In such a case the means can take the form of a delay circuit which can either by fixed or variable.

As an alternative, the means may comprise an inverter circuit provided in the connection of the pulse train to the clock input of one of the flip-flops, the divided pulse train at the output of said first flip-flop leading the divided pulse train at the corresponding output of the second flip-flop by 90 degrees. In such a case there is a 180 degrees phase difference between the pulse trains at the clock inputs of the respective flip-flops and it does not matter to which of these inputs the inverter is connected.

BRIEF DESCRIPTION OF THE DRAWINGS

The above and other features of the invention will now be described, by way of example, with reference to the accompanying drawings in which.

DETAILED DESCRIPTION OF THE INVENTION

Figure 1:
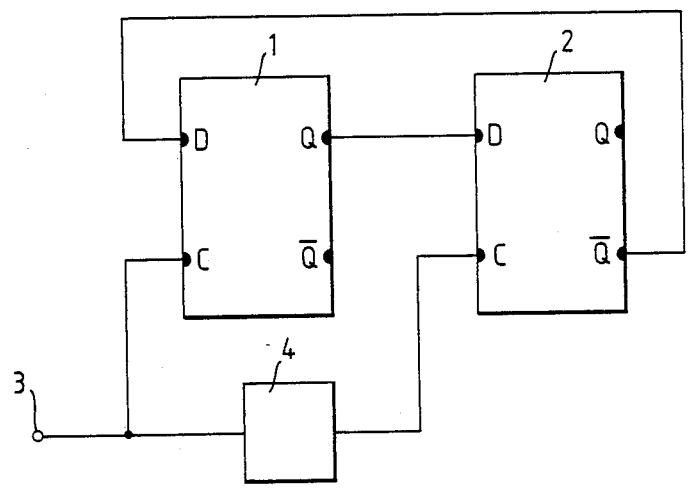
FIG. 1 is a block diagram of a pulse train divider circuit according to the invention.

FIG. 1 shows a first D-type flip-flop 1 connected to a second D-type flip-flop 2 such that the Q output of flip-flop 1 is connected to the D input of flip-flop 2 whose $\bar{Q}$ output is connected to the D input of flip-flop 1. The pulse train to be divided is applied by way of an input 3 directly to the clock input C of flip-flop 1 and via a circuit 4 to the clock input C of flip-flop 2. The circuit 4 changes the phase relationship, within limits, of the pulse train applied to the second flip-flop 2 with respect to that applied to the first flip-flop 1 and may take the form of a delay circuit.

Figure 2:
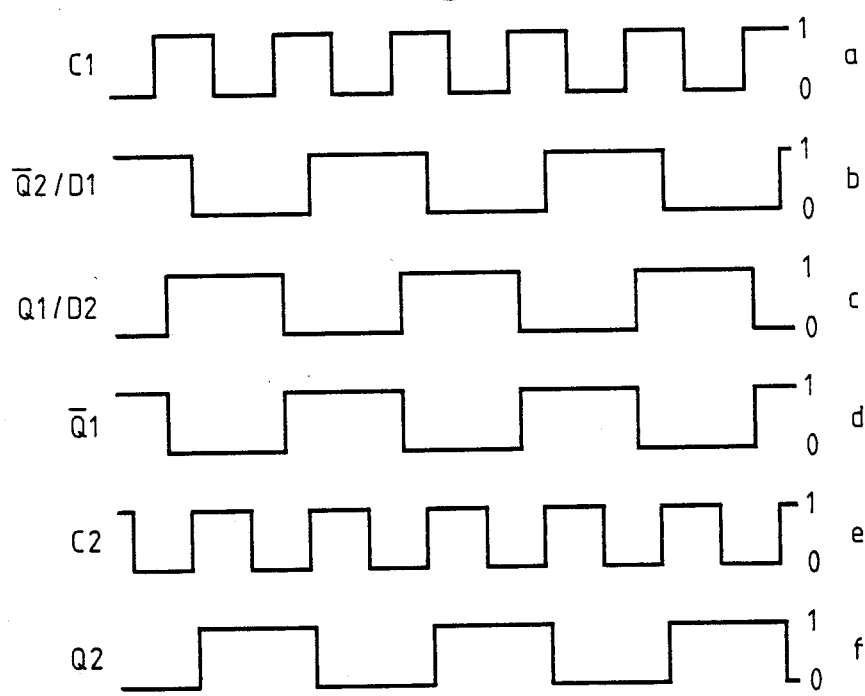
FIG. 2 shows pulse diagrams for explaining the operation of FIG. 1.

The operation of the divider circuit of FIG. 1 will be described with reference to the pulse diagrams of FIG. 2 in which the two binary conditions, "1" and "0" respectively indicate the high and low conditions. In FIG. 2 the inputs and outputs of the flip-flops are indicated in the normal way, the suffix "1" or "2" indicating that they relate respectively to the first or second flip-flop. FIG. 2a shows the pulse train applied via input 3 directly to the clock input (C1) of flip-flop 1, the pulse train having a 1:1 mark:space ratio. Initially it is assumed in FIG. 2b that the D input (D1) of flip-flop 1, and hence the $\bar{Q}$ output ($\bar{Q}$2) of flip-flop 2, is high with C1 low. When C1 next goes high flip-flop 1 changes state such that its Q output (Q1), which was previously low, goes high as shown in FIG. 2c, there being a short delay in the flip-flop changing its state, with the result that the D input (D2) of flip-flop 2 becomes high. It is assumed that the circuit 4 delays the pulse train applied to terminal 3 such that there is a 90 degrees lag in the pulse train applied to the clock input (C2) of flip-flop 2, the pulse train at C2 being shown in FIG. 2e. When C2 next goes high flip-flop 2 changes its state such that output $\bar{Q}$2 goes low with the result that input D1 goes low, there again being a short delay in the flip-flop changing state. Flip-flop 1 changes back to its other state on the next occasion that the pulse train at input C1 goes high to drive output Q1, and hence input D2, low. Flip-flop 2 then changes back to its other state when next the pulse train at input C2 goes high to drive output $\bar{Q}$2, and hence input D1, low. The cycle is then repeated. A change of state of each flip-flop occurs each time its clock input goes high with the result that the applied pulse train is divided-by-two. The outputs at the $\bar{Q}$ output ($\bar{Q}$1) for flip-flop 1 and the Q output (Q2) for flip-flop are additionally shown in FIGS. 2d and 2f respectively.

From the various output pulse trains shown in FIG. 2 it will be seen that the outputs of flip-flop 1 have specific phase relationships with the outputs of flip-flop 2 and the divider circuit may be employed to provide two pulse trains with a specific phase relationship. Thus from FIG. 2 it will be seen that when C1 leads C2 by 90 degrees:

Q1 leads Q2 by 45 degrees
$\overline{Q1}$ leads $\overline{Q2}$ by 45 degrees
Q1 lags $\overline{Q2}$ by 135 degrees
$\overline{Q1}$ lags Q2 by 135 degrees.

Figure 3:
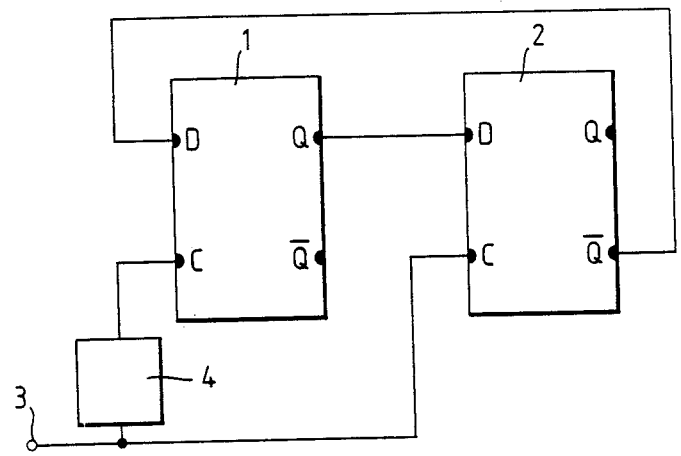
FIG. 3 is a block diagram of a modification of the divider circuit shown in FIG. 1.
Figure 4:
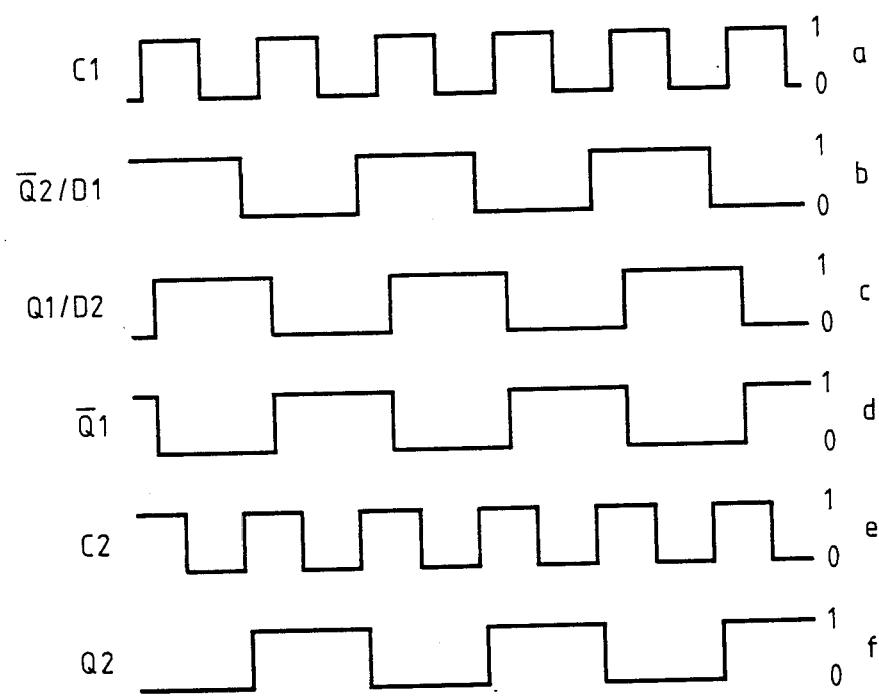
FIG. 4 shows pulse diagrams for explaining the operation of FIG. 3.

FIG. 3 shows a modification of the pulse train divider circuit shown in FIG. 1 where corresponding references indicate corresponding components. In FIG. 3 the circuit 4 is placed in the connection between terminal 3 and the clock input C of flip-flop 1 such that the applied pulse train at this clock input lags the corresponding input in flip-flop 2 by 90 degrees. FIG. 4 shows the pulse diagrams for the operation of FIG. 3 which use the same references as in FIG. 2. This operation will not be described as it will be self-evident following on from the description surrounding FIG. 1 and 2. From FIG. 4 it will be seen that when C1 lags C2 by 90 degrees the following phase relationships exist at the flip-flop outputs:

Q1 leads Q2 by 135 degrees
$\overline{Q1}$ leads $\overline{Q2}$ by 135 degrees
Q1 lags $\overline{Q2}$ by 45 degrees
$\overline{Q1}$ lags Q2 by 45 degrees.

Figure 5:
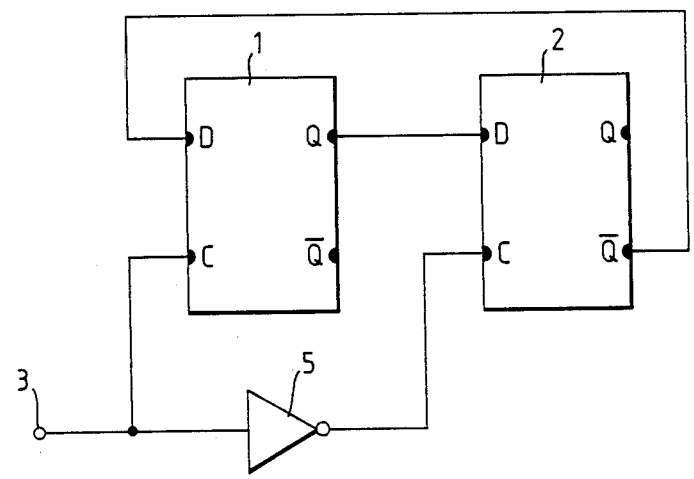
FIG. 5 is a block diagram of a further modification of the divider circuit shown in FIG. 1.
Figure 6:
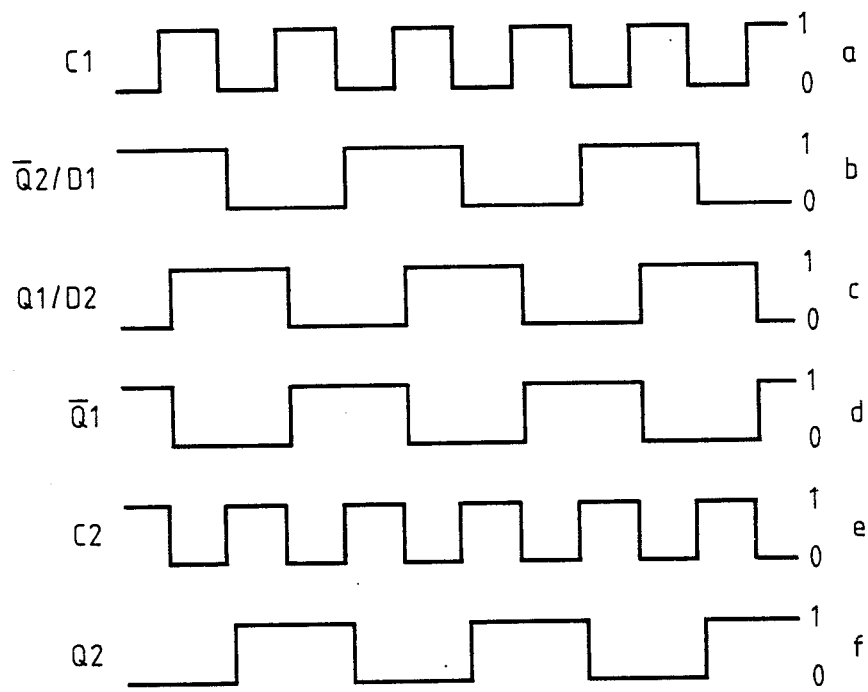
FIG. 6 shows pulse diagrams for explaining the operation of FIG. 5.

A further modification of the pulse train divider circuit of FIG. 1 is shown in FIG. 5 where corresponding references again indicate like components. In FIG. 5 the circuit 4 of FIG. 1 has been replaced by an inverter 5 such that the pulse train applied to the clock input of flip-flop 1 leads the pulse train applied to the corresponding input of flip-flop 2 by 180 degrees. FIG. 6 shows the pulse diagrams for the operation of FIG. 5 which again uses the same references as in FIG. 2. Again the operation will not be described as it will be self-evident. From FIG. 6 it will be seen that when C1 leads C2 by 180 degrees the flip-flop outputs have the following phase relationships:

Q1 leads Q2 by 90 degrees
$\overline{Q1}$ leads $\overline{Q2}$ by 90 degrees
Q1 lags $\overline{Q2}$ by 90 degrees
$\overline{Q1}$ lags Q2 by 90 degrees.

The same relationships are also obtained if the inverter 5 is provided in the connection to the clock input C of flip-flop 2 rather than flip-flop 1.

I claim:

1. A pulse train divider circuit comprising first and second D-type flip-flops having the Q output of the first flip-flop connected to the D input of the second flip-flop whose Q output is connected to the D input of the first flip-flop, the pulse train to be divided being applied to the clock inputs of each of said flip-flops, characterised in that said divider circuit additionally comprises means for causing the pulse train applied to one of said flip-flops to be out of phase with the pulse train as applied to the other of said flip-flops, the circuit being capable of providing a divided pulse train at each output of each flip-flop at half the frequency of the applied pulse train, the divided pulse train present at an output of the first flip-flop having a specific phase reltationship with the divided pulse train at an output of the second flip-flop which relationship depends on the phase relationship between the pulse trains as applied to the clock inputs of the first and second flip-flops.

2. A divider circuit as claimed in claim 1, characterised in that when said means causes the pulse train applied to the clock input of the first flip-flop to lead the pulse train applied to the corresponding input of the second flip-flop by N degrees the divided pulse train at an output of the said first flip-flop leads the divided pulse train at the corresponding output of the second flip-flop by ½N degrees.

3. A divider circuit as claimed in claim 1, characterised in that said means comprises an inverter circuit provided in the connection of the pulse train to the clock input of one of the flip-flops, the divided pulse train at the output of said first flip-flop leading the divided pulse train at the corresponding output of the second flip-flop by 90 degrees.

4. A pulse train divider circuit comprising:
   (a) a first D type flip-flop having a first clock input, a first D input, a first Q output and a first $\overline{Q}$ output;
   (b) a second D type flip-flop having a second clock input, a second D input coupled to said first Q output, a second Q output and a second $\overline{Q}$ output coupled to said first D input; and
   (c) means having an input coupled to a pulse train, for causing said pulse train to be applied to said first clock input at a specific input phase relationship to said pulse train as applied by said means to said second clock input;
   wherein a first divided pulse train is provided at said first Q output, a second divided pulse train is provided at said first $\overline{Q}$ output, a third divided pulse train is provided at said second Q output and a fourth divided pulse train is provided at said second $\overline{Q}$ output and said first and second divided pulse trains have a specific output phase relationship to said third and fourth divided pulse trains which depends on said specific input phase relationship.

* * * * *